United States Patent
Melichar

(10) Patent No.: US 7,570,024 B2
(45) Date of Patent: *Aug. 4, 2009

(54) BATTERY STATE OF CHARGE VOLTAGE HYSTERESIS ESTIMATOR

(75) Inventor: Robert J. Melichar, Troy, MI (US)

(73) Assignee: Cobasys, LLC, Orion, MI (US)

( * ) Notice: Subject to any disclaimer, the term of this patent is extended or adjusted under 35 U.S.C. 154(b) by 161 days.

This patent is subject to a terminal disclaimer.

(21) Appl. No.: 11/301,754

(22) Filed: Dec. 13, 2005

(65) Prior Publication Data

US 2006/0091863 A1     May 4, 2006

Related U.S. Application Data

(63) Continuation-in-part of application No. 11/081,978, filed on Mar. 16, 2005, now Pat. No. 7,375,497.

(60) Provisional application No. 60/559,921, filed on Apr. 6, 2004.

(51) Int. Cl.
*H02J 7/00* (2006.01)
*H02J 7/16* (2006.01)

(52) U.S. Cl. ...................... 320/149; 320/132

(58) Field of Classification Search ............ 320/104, 320/132, 133, 134, 149
See application file for complete search history.

(56) References Cited

U.S. PATENT DOCUMENTS

| | | |
|---|---|---|
| 4,394,741 A | 7/1983 | Lowndes |
| 4,558,281 A | 12/1985 | Codd et al. |
| 4,876,513 A | 10/1989 | Brilmyer et al. |
| 5,119,011 A | 6/1992 | Lambert |
| 5,295,078 A | 3/1994 | Stich et al. |
| 5,321,627 A | 6/1994 | Reher |
| 5,412,323 A | 5/1995 | Kato et al. |
| 5,698,965 A * | 12/1997 | York .......................... 307/130 |
| 6,064,180 A * | 5/2000 | Sullivan et al. ............. 320/132 |

(Continued)

FOREIGN PATENT DOCUMENTS

DE     101 47 565 A1     4/2003

(Continued)

OTHER PUBLICATIONS

U.S. Appl. No. 11/081,978, filed Mar. 16, 2005.

(Continued)

*Primary Examiner*—Akm E Ullah
*Assistant Examiner*—Ramy Ramadan
(74) *Attorney, Agent, or Firm*—Harness, Dickey & Pierce, P.L.C.

(57) ABSTRACT

A battery control module is provided for use with a battery and includes a voltage measuring module that measures battery voltage, a current measuring module that measures battery current, and a state of charge (SOC) module that communicates with said current and voltage measuring modules. In some features, the SOC module determines an unfiltered SOC of said battery, a characteristic of said unfiltered SOC, and a modified SOC that is based on said unfiltered SOC and said characteristic. In other features, the SOC module determines first and second reset voltages, compares the battery voltage to the first and second reset voltages, and determines an unfiltered SOC based on said first and second reset voltages and said battery voltage.

14 Claims, 13 Drawing Sheets

U.S. PATENT DOCUMENTS

| | | | |
|---|---|---|---|
| 6,064,182 A * | 5/2000 | Eguchi | 320/132 |
| 6,094,052 A | 7/2000 | Arai et al. | |
| 6,160,380 A | 12/2000 | Tsuji et al. | |
| 6,232,744 B1 | 5/2001 | Kawai et al. | |
| 6,359,419 B1 | 3/2002 | Verbrugge et al. | |
| 6,388,447 B1 | 5/2002 | Hall et al. | |
| 6,417,668 B1 | 7/2002 | Howard et al. | |
| 6,586,130 B1 * | 7/2003 | Guiheen et al. | 429/50 |
| 6,777,914 B2 * | 8/2004 | Ullrich et al. | 320/132 |
| 2002/0113594 A1 | 8/2002 | Satake | |
| 2002/0113595 A1 * | 8/2002 | Sakai et al. | 324/433 |
| 2002/0171429 A1 * | 11/2002 | Ochiai et al. | 324/426 |
| 2003/0112011 A1 | 6/2003 | Guitheen et al. | |
| 2003/0169049 A1 | 9/2003 | Kawaguchi et al. | |
| 2004/0119441 A1 * | 6/2004 | Koo | 320/104 |
| 2004/0162683 A1 | 8/2004 | Verbrugge et al. | |
| 2004/0257087 A1 * | 12/2004 | Murakami | 324/426 |
| 2005/0003925 A1 * | 1/2005 | Wakashiro et al. | 477/2 |
| 2005/0057255 A1 | 3/2005 | Tate, Jr. et al. | |
| 2006/0022643 A1 * | 2/2006 | Brost et al. | 320/132 |
| 2006/0055374 A1 * | 3/2006 | Fujihara et al. | 320/132 |

FOREIGN PATENT DOCUMENTS

| | | |
|---|---|---|
| DE | 10147562 | 4/2003 |
| EP | 0 560 468 A | 9/1993 |
| EP | 1 085 592 A | 3/2001 |
| EP | 1 139 464 A2 | 10/2001 |
| EP | 1 220 413 A | 7/2002 |
| EP | 1 555 537 A1 | 7/2005 |
| GB | 2086060 A | 5/1982 |
| WO | WO 2005/101042 | 10/2005 |

OTHER PUBLICATIONS

U.S. Appl. No. 11/081,979, filed Mar. 16, 2005.
U.S. Appl. No. 11/081,980, filed Mar. 16, 2005.
International Search Report dated Sep. 12, 2005 for Application No. PCT/US2005/011761; 6 pages.
Notification of Transmittal of the International Search Report and the Written Opinion of the International Searching Authority, or the Declaration for PCT International Application No. PCT/US2006/047126, International Filing Date Dec. 8, 2006; mailed Apr. 12, 2007; 6 Pages.
Written Opinion of the International Search Authority for PCT Application No. PCT/US2006/047126, International Filing Date Dec. 8, 2006; mailed Apr. 12, 2007; 7 Pages.

* cited by examiner

BATTERY STATE OF CHARGE VOLTAGE HYSTERESIS ESTIMATOR

CROSS-REFERENCE TO RELATED APPLICATIONS

This application is a continuation-in-part of U.S. patent application Ser. No. 11/081,978 filed on Mar. 16, 2005, which claims the benefit of U.S. Provisional Application No. 60/559,921, filed on Apr. 6, 2004. This application is related to U.S. patent application Ser. No. 11/081,979 filed on Mar. 16, 2005, and Ser. No. 11/081,980 filed on Mar. 16, 2005. The disclosures of the above applications are incorporated herein by reference in their entirety.

FIELD OF THE INVENTION

The present invention relates to battery systems, and more particularly to state of charge tracking systems for battery systems.

BACKGROUND OF THE INVENTION

Battery systems may be used to provide power in a wide variety of applications. Exemplary transportation applications include hybrid electric vehicles (HEV), electric vehicles (EV), Heavy Duty Vehicles (HDV) and Vehicles with 42-volt electrical systems. Exemplary stationary applications include backup power for telecommunications systems, uninterruptible power supplies (UPS), and distributed power generation applications.

Examples of the types of batteries that are used include nickel metal hydride (NiMH) batteries, lead-acid batteries and other types of batteries. A battery system may include a plurality of battery subpacks that are connected in series and/or in parallel. The battery subpacks may include a plurality of batteries that are connected in parallel and/or in series.

The maximum and/or minimum power that can be delivered by batteries, battery subpacks and/or battery systems varies over time as a function of a temperature of the batteries, battery state of charge (SOC) and/or battery age. Therefore, accurate estimation of battery SOC is important to the determination of maximum and minimum power.

The energy that can be provided by or sourced to a battery is a function of state of charge. When the battery state of charge is known and targeted during operation, an optimal ratio can maintained between the ability to accept amp-hours in charge and to provide amp-hours in discharge. As this optimal ratio can be maintained, there is a reduced need to oversize the battery system to assure adequate power assist and regeneration energy.

For example in transportation applications such as HEVs or EVs, it is important for the powertrain control system to know the maximum and/or minimum power limit of the battery system. The powertrain control system typically receives an input request for power from an accelerator pedal. The powertrain control system interprets the request for power relative to the maximum power limit of the battery system (when the battery system is powering the wheels). The minimum power limits may be relevant during recharging and/or regenerative braking. Exceeding the maximum and/or minimum power limits may damage the batteries and/or the battery system and/or reduce the operational life of the batteries and/or the battery system. Being able to estimate the battery SOC accurately has been somewhat problematic—particularly when the battery system includes NiMH batteries.

SUMMARY OF THE INVENTION

A battery control module is provided for use with a battery and includes a voltage measuring module that measures battery voltage, a current measuring module that measures battery current, and a state of charge (SOC) module. The SOC module communicates with the current and voltage measuring modules, determines a reset voltage based on the battery current, compares the battery voltage and the reset voltage, and resets a battery SOC based on an outcome of the comparison.

In other features, a battery control module is provided for use with a battery and includes a voltage measuring module that measures battery voltage, a current measuring module that measures battery current, and a state of charge (SOC) module that communicates with the current and voltage measuring modules. The SOC module estimates an open circuit voltage based on the battery current and the battery voltage and estimates a SOC based on the open circuit voltage.

In other features, a battery control module is provided for use with a battery and includes a voltage measuring module that measures battery voltage, a current measuring module that measures battery current, and a state of charge (SOC) module that communicates with said current and voltage measuring modules. The SOC module determines an unfiltered SOC of said battery, a characteristic of said unfiltered SOC, and a modified SOC that is based on said unfiltered SOC and said characteristic.

In other features, a battery control module is provided for use with a battery and includes a voltage measuring module that measures battery voltage, a current measuring module that measures battery current, and a state of charge (SOC) module that determines first and second reset voltages, compares the battery voltage to the first and second reset voltages, and determines an unfiltered SOC based on said first and second reset voltages and said battery voltage.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
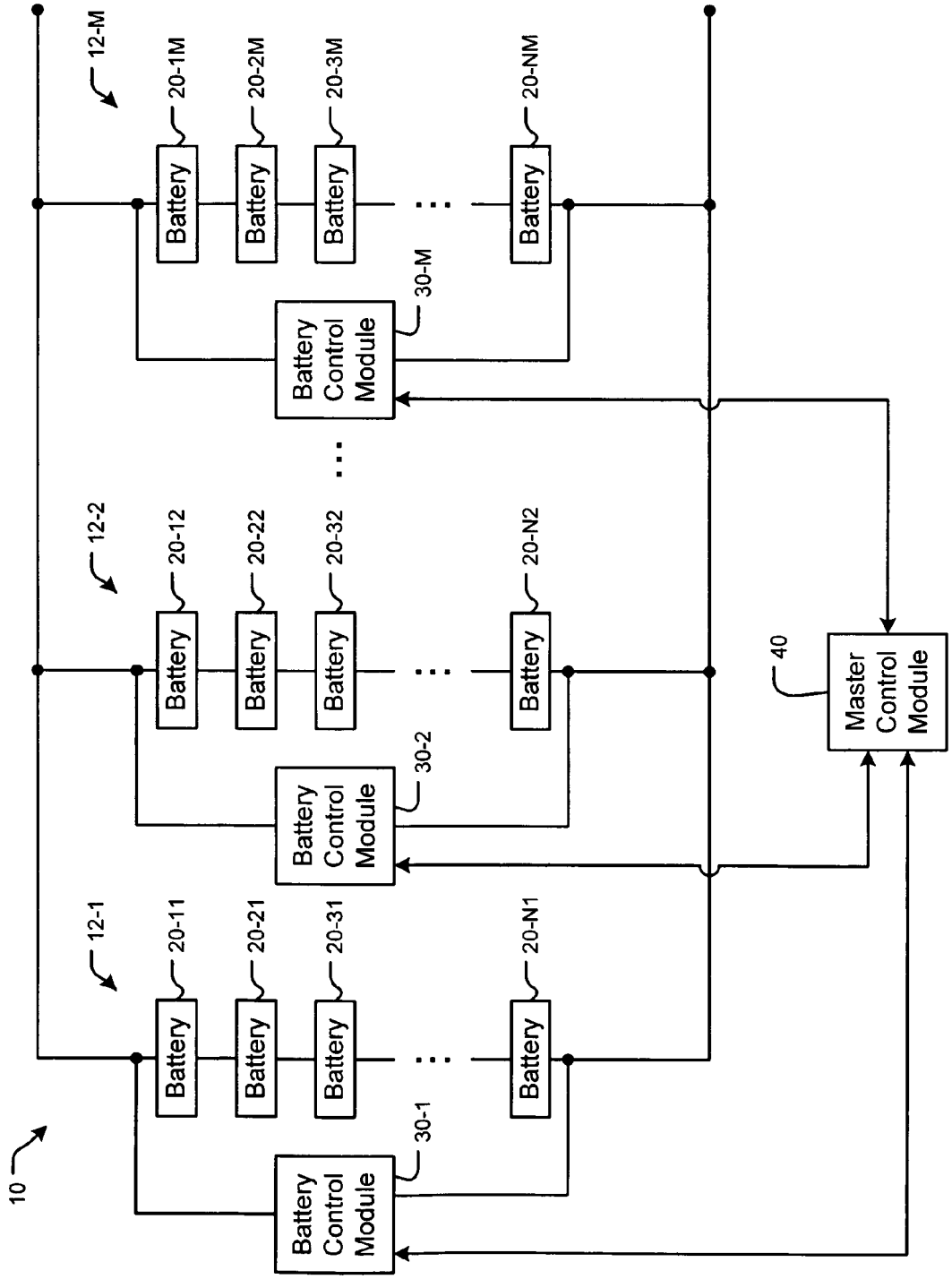
FIG. 1 is a functional block diagram of a battery system including battery subpacks, battery control modules and a master control module.

The following description of the preferred embodiment(s) is merely exemplary in nature and is in no way intended to limit the invention, its application, or uses. For purposes of clarity, the same reference numbers will be used in the drawings to identify the same elements. As used herein, the term module or device refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the term current swing refers to current integrated over a duration during which the charge (polarity) is in one direction. Charge swing may be expressed in units of Amp-seconds or A-s.

An exemplary system that can be used to calculate the SOC will be shown, although skilled artisans will appreciate that other systems may be used. Referring now to FIG. 1, an exemplary embodiment of a battery system 10 is shown to include M battery subpacks 12-1, 12-2, . . . , and 12-M (collectively battery subpacks 12). The battery subpacks 12-1, 12-2, . . . , and 12-M include N series connected batteries 20-11, 20-12, . . . , and 20-NM (collectively batteries 20). Battery control modules 30-1, 30-2, . . . and 30-M (collectively battery control modules 30) are associated with each of the battery subpacks 12-1, 12-2, . . . and 12-M, respectively. In some embodiments, M is equal to 2 or 3, although additional or fewer subpacks may be used. In some embodiments, N is equal to 12-24, although additional and/or fewer batteries may be used.

The battery control modules 30 sense voltage across and current provided by the battery subpacks 12. Alternatively, the battery control modules 30 may monitor one or more individual batteries 20 in the battery subpacks 12 and appropriate scaling and/or adjustment is performed. The battery control modules 30 communicate with a master control module 40 using wireless and/or wired connections. The master control module 40 receives the power limits from the battery control modules 30 and generates a collective power limit. The SOC can be calculated for each module, in groups and/or collectively. The battery control module 30 may be integrated with the master control module 40 in some embodiments.

Figure 2:
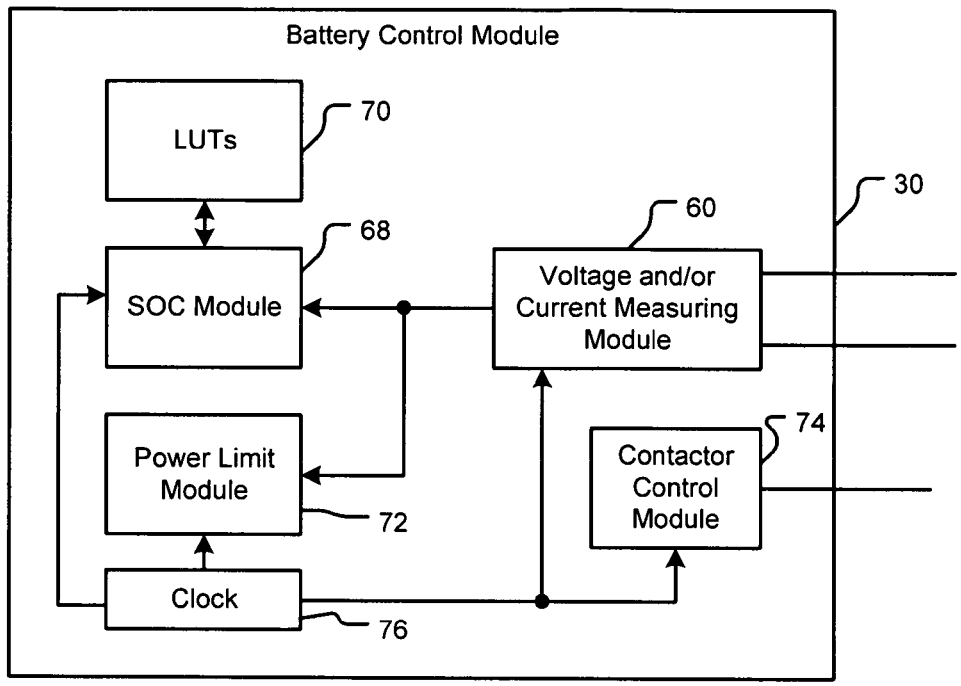
FIG. 2 is a more detailed functional block diagram of a battery control module.

Referring now to FIG. 2, some of the elements of the battery control modules 30 are shown. The battery control modules 30 include a voltage and/or current measuring module 60 that measures voltage across the battery subpack 12 and/or across one or more individual batteries 20 in the battery subpack 12. The battery control modules 30 further include a battery state of charge (SOC) module 68 that periodically calculates the SOC of the batteries 20 in the battery subpacks 12. In one implementation, the SOC module 68 uses a power ratio estimation and/or $V_O$ approach, as will be described below. In another implementation, the SOC module 68 uses a relaxation voltage SOC estimation approach, as will be described below. The SOC module 68 may employ a lookup table 70, formulas and/or other methods.

A power limit module 72 calculates a maximum current limit $I_{lim}$, voltage limit $V_{lim}$, and/or power limit $P_{lim}$ for the battery subpack 12 and/or one or more batteries 20 in the battery subpack 12, as will be described further below. The limits may be maximum and/or minimum limits. A contactor control module 74 controls one or more contactors (not shown) that are associated with the control and/or connection of the batteries 20 in the battery subpacks 12. A clock circuit 76 generates one or more clock signals for one or more modules within the battery control module 30.

Figure 3:
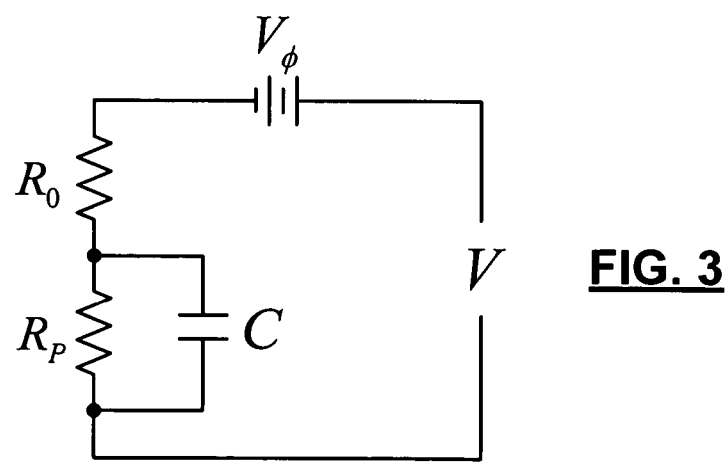
FIG. 3 is an equivalent circuit of a battery.

Referring now to FIG. 3, an equivalent circuit for the battery 20 is shown where $R_O$ represents ohmic resistance of the battery, $V_p$ represents the polarization voltage, $V_O$ represents the open circuit or relaxation voltage, I represents battery current and V represents battery voltage. V and I are measured values. $R_p$ varies with temperature, duration of applied current and SOC. $V_O$ and $R_O$ vary primarily with SOC. $V_P$ is equal to measured current I times $R_p$. Using the equivalent circuit and Kirchoffs voltage rules for the battery 20, $V=V_O+V_P+IR_O$.

Relaxation voltage is relatively insensitive to temperature and current demand and is a good indicator of SOC. A set of specialized current pulses can be used to condition the battery to yield SOC dependent relaxation voltages. This approach is referred to herein as relaxation voltage SOC estimation.

Figure 4:
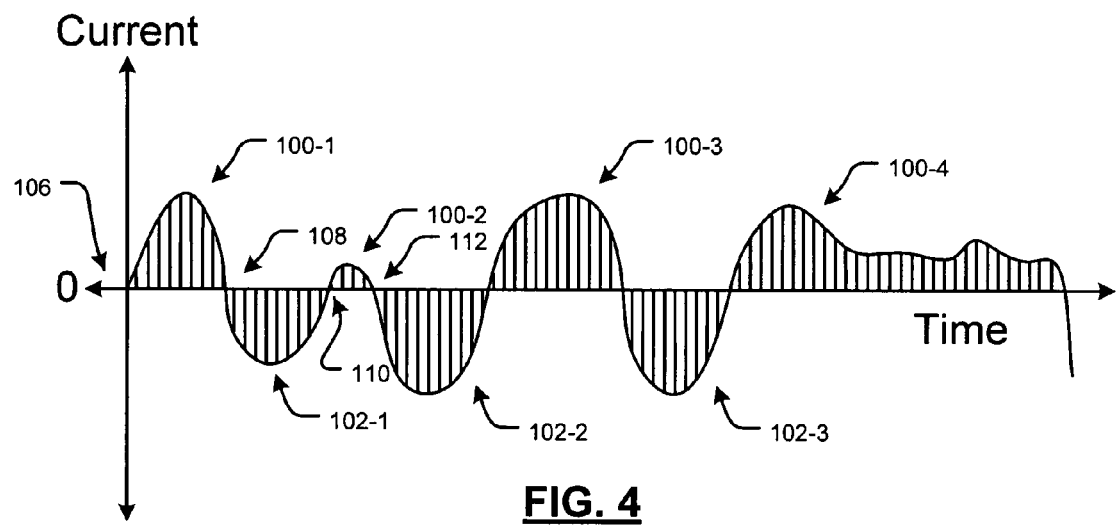
FIG. 4 is a graph of battery current as a function of time.

Referring now to FIG. 4, battery current is shown as a function of time. Current that is greater than zero, for example at 100-1, 100-2, 100-3, and 100-4, is charging current. Current that is less than zero, for example at 102-1, 102-2, and 102-3, is discharging current. The areas under the curve between points 106 and 108 and points 110 and 112 are defined as a charge swing in A-s. The area under the current curve between points 108 and 110 is defined as a discharge swing in A-s.

Figure 5A:
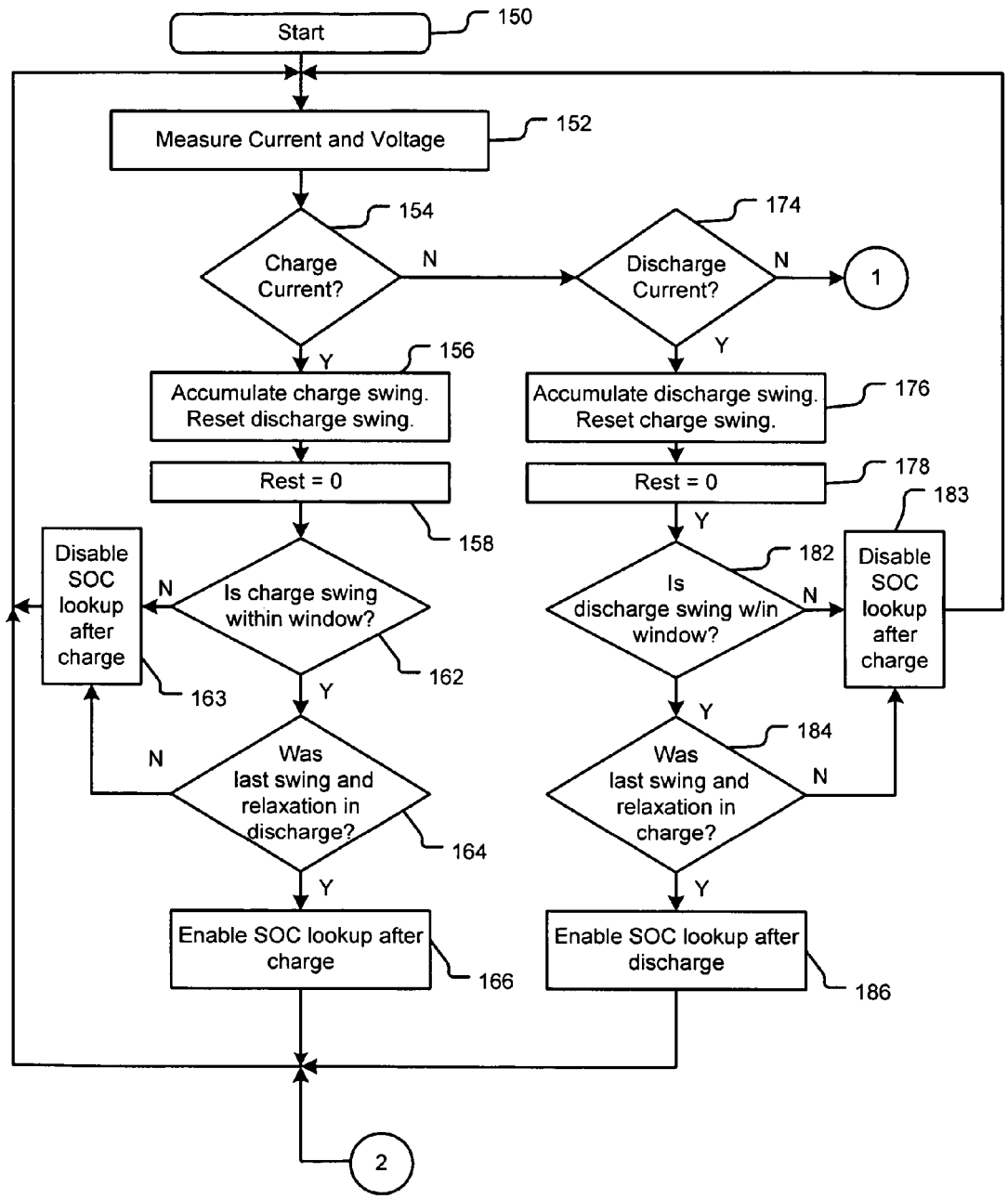
FIGS. 5A and 5B are flowcharts illustrating steps of a relaxation voltage approach for estimating state of charge.
Figure 5B:
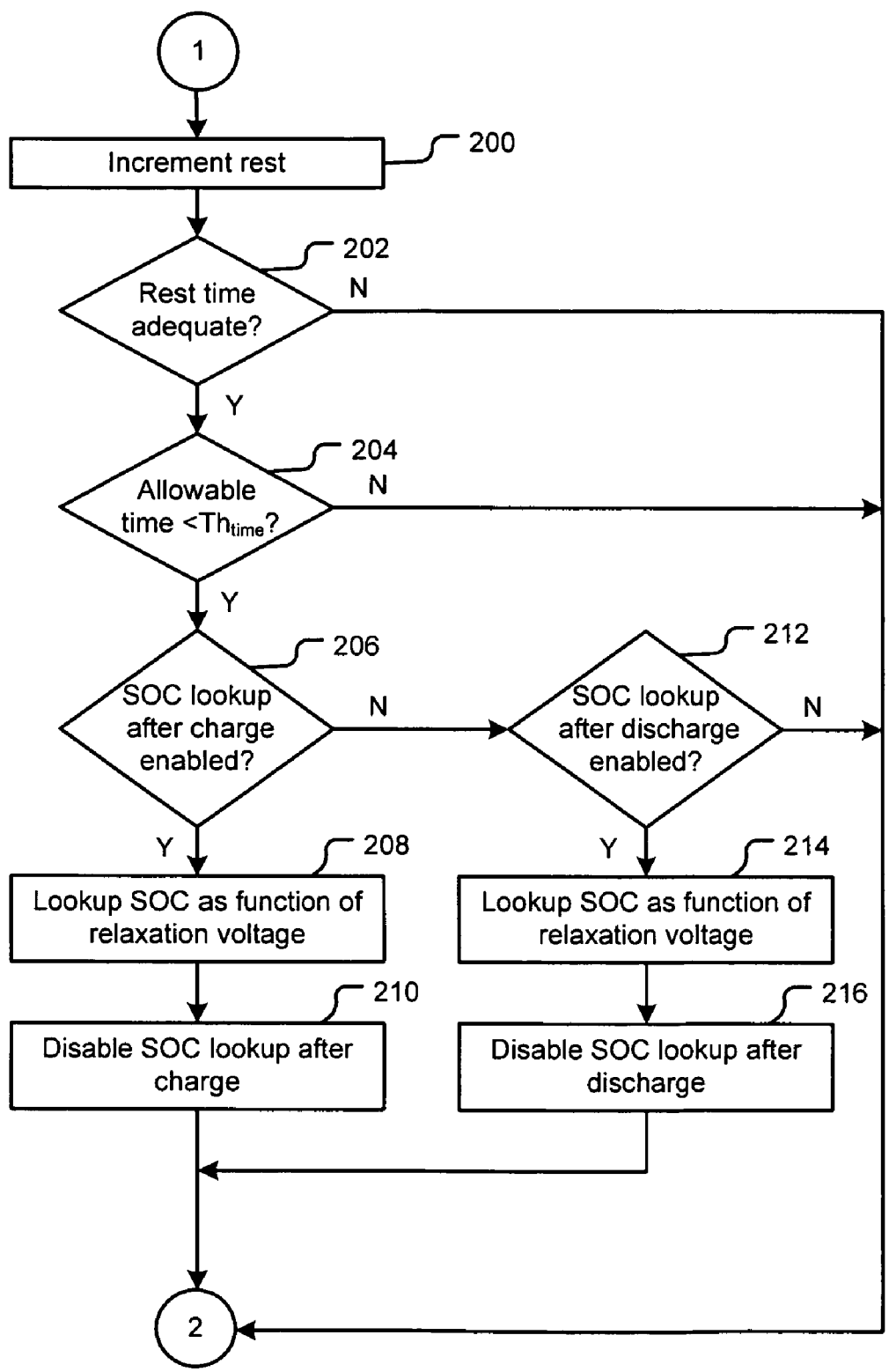

Referring now to FIGS. 5A and 5B, steps of a method for implementing a relaxation voltage SOC estimation approach are shown. The relaxation voltage estimation approach monitors battery current for a pair of power pulses, checks relaxation voltage after each and determines SOC using the lookup table 70. The relaxation voltage approach was derived based on the observation of voltage responses to pulses throughout a range operating of temperatures, such as −15° C. to 45° C. The relaxation voltages were affected by swing amplitudes, pulse amplitudes and whether the battery was brought from top of charge or bottom of charge.

In FIGS. 5A and 5B, control begins with step 150. In step 152, the current and voltage are measured. In step 154, control determines whether the measured current is charge current (current>zero or a predetermined threshold). If step 154 is true, control accumulates charge swing and resets discharge swing in step 156. In step 158, control sets a rest variable equal to zero. In step 162, control determines whether the accumulated charge swing is within a predetermined window. The window may include upper and lower thresholds. In some implementations, the upper and lower thresholds are between 10% and 100% of battery capacity, although other values may be used. If not, control disables SOC lookup after charge in step 163 and returns to step 152.

If step 162 is true, control continues with step 164 and determines whether last swing and relaxation occurred in discharge. As used herein, relaxation refers to battery voltage asymptotically approaching the relaxation voltage. If not, control continues with step 163. If step 164 is true, control enables SOC lookup after charge in step 166.

If step 154 is false, control continues with step 174. In step 174, control determines whether the measured current is discharge current (current<zero or a predetermined threshold). If step 174 is true, control accumulates discharge swing and resets charge swing in step 176. In step 178, control sets the rest variable equal to zero. In step 182, control determines whether the accumulated discharge swing is within a predetermined window. The window may include upper and lower thresholds that may be similar to the accumulated charge swing thresholds or different therefrom. If not, control disables SOC lookup after discharge in step 183 and returns to step 152.

If step 182 is true, control continues with step 184 and determines whether last swing and relaxation occurred in charge. If not, control continues with step 183. If step 184 is true, control enables SOC lookup after discharge in step 186.

If step 174 is false, control continues in FIG. 5B with step 200 and increments the rest variable. In step 202, control determines whether rest time is adequate by comparing rest time to a threshold. In some implementations, approximately 120 seconds is used as a threshold, although other values may be used. If step 202 is true, control determines whether allowable time is less than a threshold time $Th_{time}$ in step 204. In some implementations, allowable time is equal to 240 seconds, although other values may be used. Exceeding this value tends to indicate that the pulses were not controlled enough for an SOC estimation.

If step 204 is true, control continues with step 206 and determines whether SOC lookup after charge is enabled. If step 206 is true, control looks up SOC as a function of relaxation voltage in step 208 and disables SOC lookup after charge in step 210 and control returns to step 152. If step 206 is false, control continues with step 212 and determines whether SOC lookup after discharge is enabled. If step 212 is true, control looks up SOC as a function of relaxation voltage in step 214 and disables SOC lookup after discharge in step 216 and control returns to step 152. If steps 202, 204 or 212 are false, control returns to step 152.

The power ratio SOC estimation approach monitors power pulse pairs. The method calculates the ratio of power capabilities in charge and discharge when the swings of the pulse pairs are approximately equal. The SOC is a function of the power ratio and is determined by a lookup table. The algorithm was derived while attempting to use inputs of current and voltage to solve for relaxation voltage $V_O$.

The voltage equation as the maximum or minimum power is held to a voltage limit is $V_{lim}=V_0+V_P+I_{lim}R_0$. Substitution of the calculation for $V_0+V_P$ from a prior sampling interval into the equation for $V_{lim}$ yields $V_{lim}=(V-IR_O)+I_{lim}R_O$. In this case, we are assuming that $V_0+V_P$ for the current sampling interval is approximately equal to $V_0+V_P$ of the prior sampling interval (in other words, $V_0+V_P \cong V_{t=i-1}-I_{t=i-1}R_0$). This approximation is valid if the sampling interval is sufficiently small since the battery and ambient conditions are very similar. For example in some implementations, a sampling interval 10 ms<T<500 ms may be used, although other sampling intervals may be used. In one embodiment, T=100 ms. Sampling intervals of 1 second have been used successfully. If the sampling interval is determined to be excessive in duration then $R_O$ would be increased as a constant or as a temperature dependent variable.

Solving for $I_{lim}$ yields the following:

$$I_{lim} = \frac{V_{lim} - V_{t=i-1} + I_{t=i-1}R_0}{R_0}.$$

Therefore, since $P_{lim} = V_{lim}I_{lim}$, $$P_{lim} = V_{lim}\left(\frac{V_{lim} - V_{t=i-1} + I_{t=i-1}R_0}{R_0}\right).$$

At the time that power limit is established for a charge or discharge swing and measured current, the measured current and voltage values are stored. When the current is reversed, the swing amplitude passes the negative of the retained swing, and the current is approximately equal to the negative of the retained current, a power limit calculation is performed.

The power ratio is calculated by taking $P_{lim}$ in charge divided by $-P_{lim}$ in discharge for adjacent cycles. Even though $V_0$ and $V_p$ are no longer in the equation, their contributions are reflected in current and voltage measurements, which are functions of both the polarization build up and $V_O$. The polarization voltage $V_p$ during a charge swing is approximately equal to the polarization voltage $V_p$ during a discharge swing of approximately equal negative. Using this approximation, the power ratio SOC estimation is used to remove $V_p$ from the calculation. The use of the power limit ratio has the effect of adding consideration of the low discharge power at low SOC and the low charge acceptance at high SOC to the stated charge determination.

Figure 6:
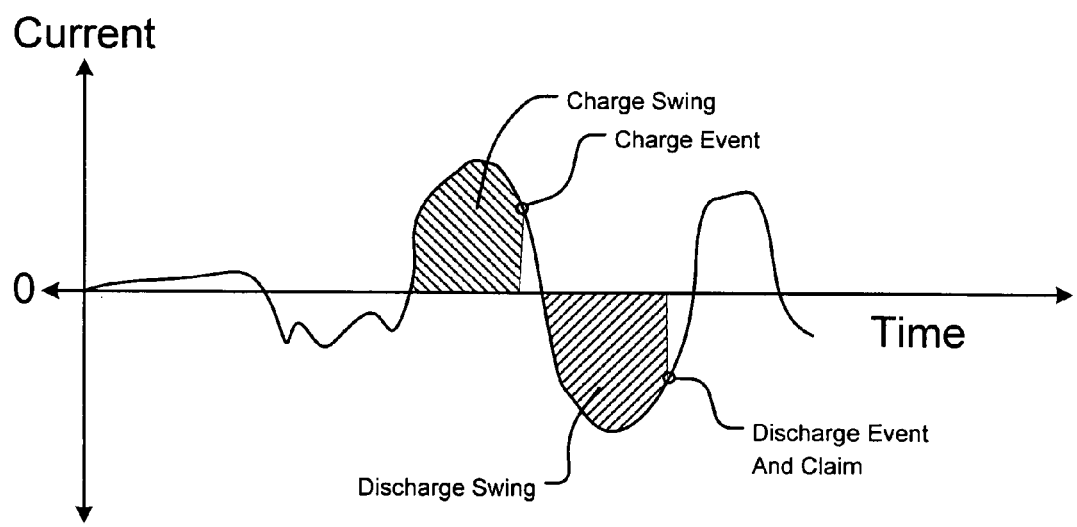
FIG. 6 is a graph of battery current as a function of time with charge and discharge swing and charge, and discharge events shown.

In FIG. 6, the battery current is shown. The present invention monitors charge and discharge swing and declares charge and discharge events under certain circumstances. A charge swing event occurs when the charge swing is greater than a charge swing threshold. A discharge event occurs when a discharge swing is greater than a discharge swing threshold. The thresholds may be related to or based on a prior charge or discharge event. For example, a charge swing threshold may be set equal to the absolute value of a prior discharge event. A discharge swing threshold may be set equal to the absolute value of a prior charge event. Still other approaches may be used to determine the charge and discharge thresholds. As used herein, the term claim refers to situations when a charge or discharge event is followed by a respective discharge or charge swing and when other conditions described below are met. The occurrence of discharge event is determined independently from the occurrence of the discharge claim, to different criteria. The algorithm looks for both simultaneously. For example, the claim point occurs at the time that the area discharge swing is equal to the previous charge swing. The event point occurs when the ratio current vs. discharge current MIN is roughly equal to the ratio current at charge event vs. charge current MAX. This would be the case if L=K in FIG. 7. In some implementations, L and K are between 1 and 2, although other values may be used.

Figure 7:
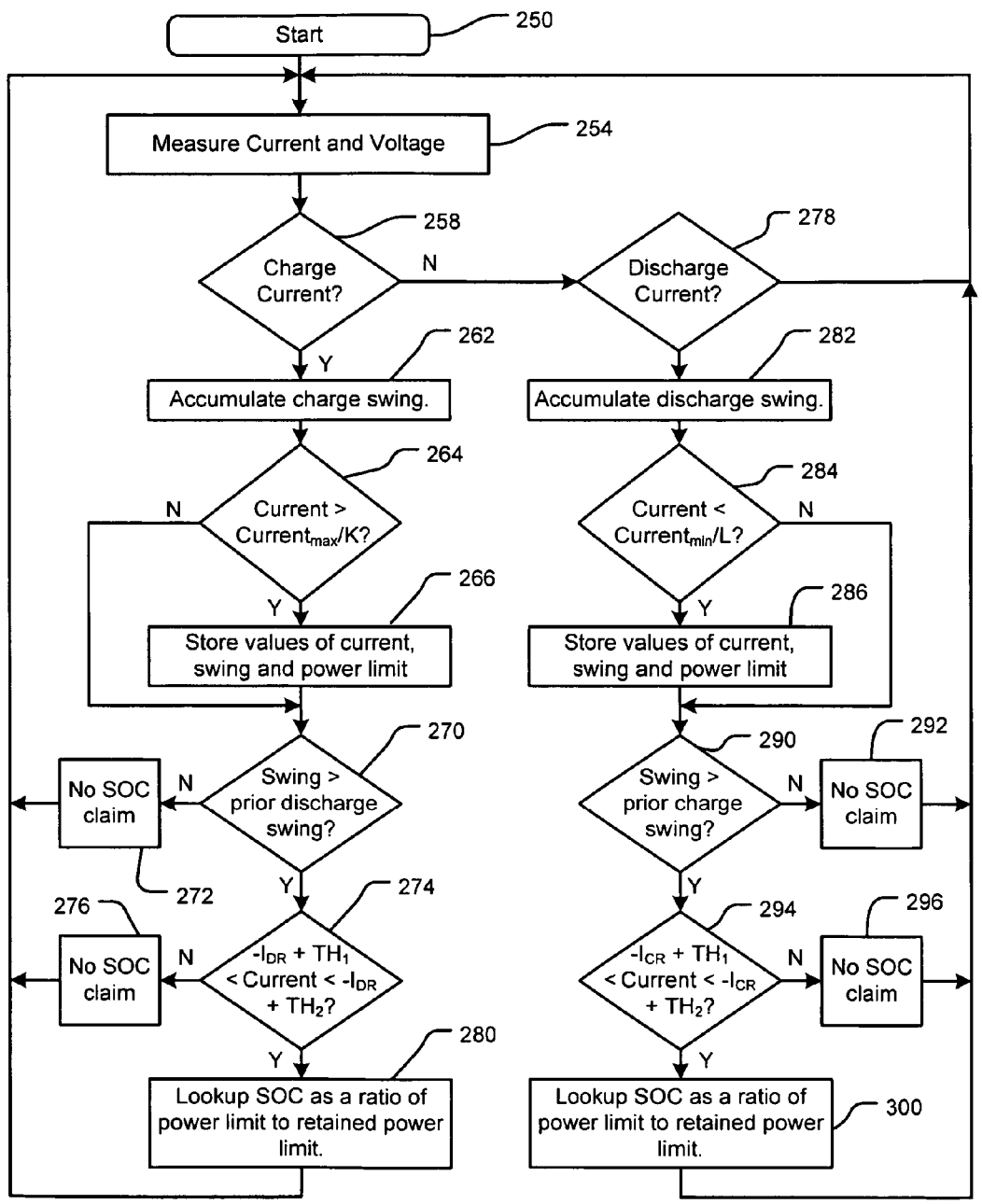
FIG. 7 is a flowchart illustrating a power ratio approach of estimating battery state of charge.

Referring now to FIG. 7, the power ratio SOC estimation method according to the present invention is shown in further detail. Control begins with step 250. In step 254, control measures current and voltage. In step 258, control determines whether there is a charge current. Charge current is defined by positive current above zero or a predetermined positive threshold. If step 258 is true, control continues with step 262 and accumulates charge swing. In step 264, control determines whether the current during the charge swing passes a maximum value and is greater than $Current_{max}/K$. When step 264 is true, control stores values of current, charge swing and power limit in step 266. If not, control continues past step 266 to step 270. In step 270, control determines whether the swing is greater than the prior discharge swing. If not, control does not make an SOC claim in step 272 and control continues with step 254.

If step 270 is true, control determines whether the current is approximately equal to a retained discharge current $-I_{DR}$ (in other words within upper and lower thresholds thereof) in step 274. If step 274 is true, control looks up SOC as a ratio of power limit to retained power limit in step 280. If step 274 is false, then control continues to step 276 and inhibits making a SOC claim for the remainder of the present swing. Control then proceeds from step 276 to step 254.

If step 258 is false, control continues with step 278 and determines whether discharge current is present. Discharge current is present when discharge current is less than zero or a predetermined negative threshold. If step 278 is false, control returns to step 254. If step 278 is true, control continues with step 282 and accumulates discharge swing. In step 284, control determines whether the current during the discharge swing passes a minimum value and is less than Current$_{min}$/L. When step 284 is true, control stores values of current, the discharge swing and power limit in step 286. If not, control continues past step 286 to step 290. In step 290, control determines whether the discharge swing is greater than the prior charge swing. If not, control does not make an SOC claim in step 292 and control continues with step 254.

If step 290 is true, control determines whether the current is approximately equal to a retained charge current $-I_{CR}$ (in other words within upper and lower thresholds thereof) in step 294. If step 294 is true, control looks up SOC as a ratio of power limit to retained power limit in step 300. If step 294 is false, then control continues to step 296 and inhibits making a SOC claim for the remainder of the present swing. Control then proceeds from step 296 to step 254.

Figure 8:
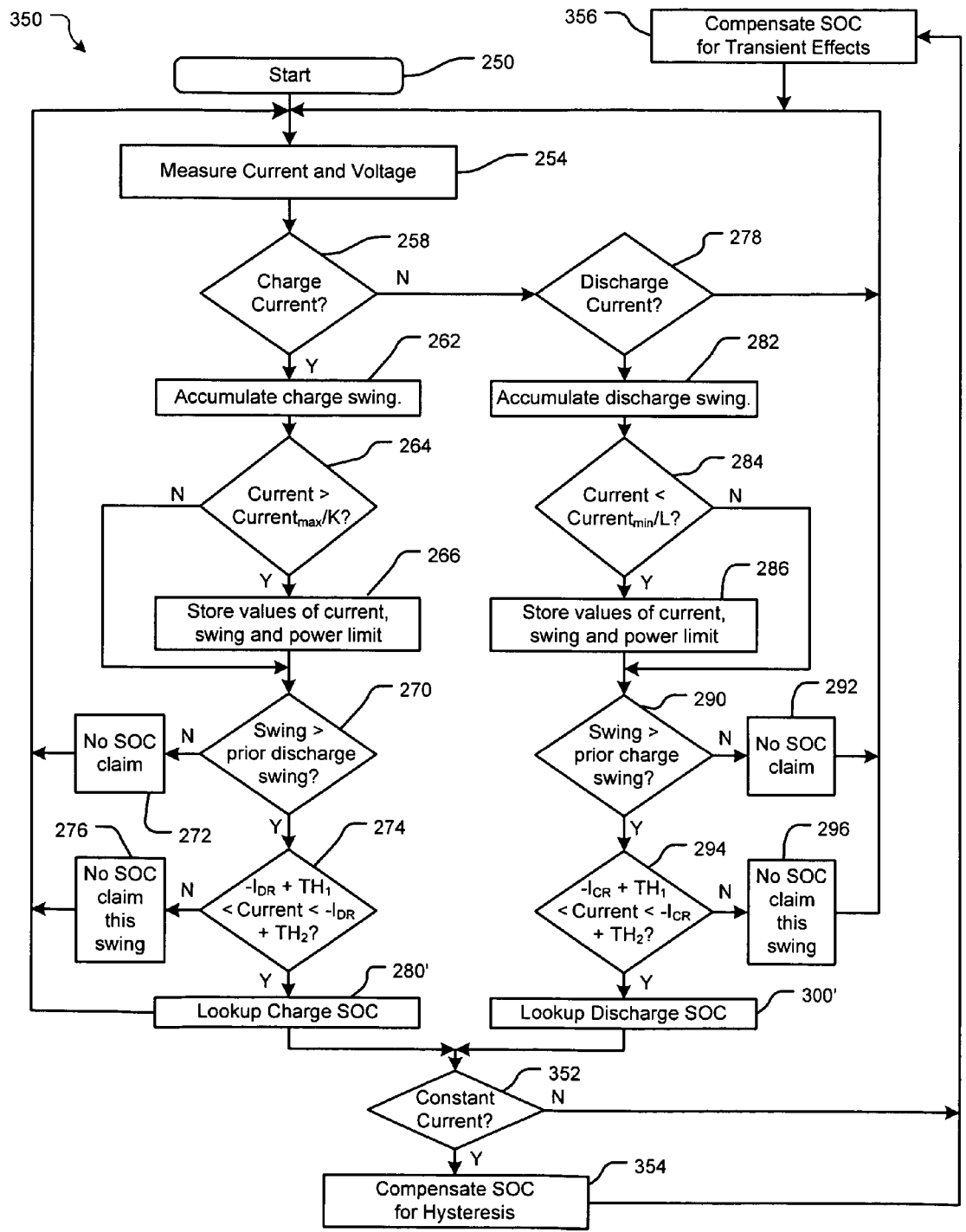
FIG. 8 is a flowchart illustrating an open-circuit voltage approach of estimating battery state of charge.

Referring now to FIG. 8, an open-circuit voltage SOC estimation method 350 is shown. The method 350 provides an alternative to the power ratio SOC estimation method of FIG. 7. The method 350 executes the same steps as the power ratio SOC estimation method with the exception of steps 280 and 300. In the method 350, the steps 280 and 300 of FIG. 7 are replaced with steps 280' and 300'. The method 350 also includes additional steps 352, 354, and 356. Steps 352 and 354 compensate the estimated SOC for a hysteresis property of batteries. Step 356 compensates the SOC from steps 280' and 300' for effects due to transients in the SOC values from claim to claim. The hysteresis compensation and SOC transient compensation algorithms are discussed below in more detail.

In step 280', control has determined that the battery is charging and determines the charging open circuit voltage $V_O$ in accordance with the equation $$V_O = V + vDschEvent - (I + iDschEventHeld)*R_O)/2,$$

where V and I are the measured values from step 254, vDschEvent is the voltage during the previous discharge event, and iDschEventHeld is the current during the previous discharge event. Control uses the charging open circuit voltage $V_O$ to enter the lookup tables 70 and determine the SOC.

In step 300', control has determined that the battery is discharging and determines the discharging open circuit voltage $V_O$ in accordance with the equation $$V_O = V + vChgEvent - (I + iChgEventHeld)*R_O)/2,$$

where vChgEvent is the voltage during the previous charge event and iChgEventHeld is the current during the previous charge event. Control uses the discharging open circuit voltage $V_O$ to enter the lookup tables 70 and determine the SOC.

When control has completed either of steps 280' and 300', control continues with step 352 and determines whether the current has been above a predetermined magnitude and polarity for greater than a predetermined amount of time. If the result of step 352 is false, control returns to step 254. If the result of step 352 is true, control continues to step 354 and compensates the determined SOC for hysteresis effects before returning to step 254. A method for compensating for hysteresis effects is described below.

Figure 9A:
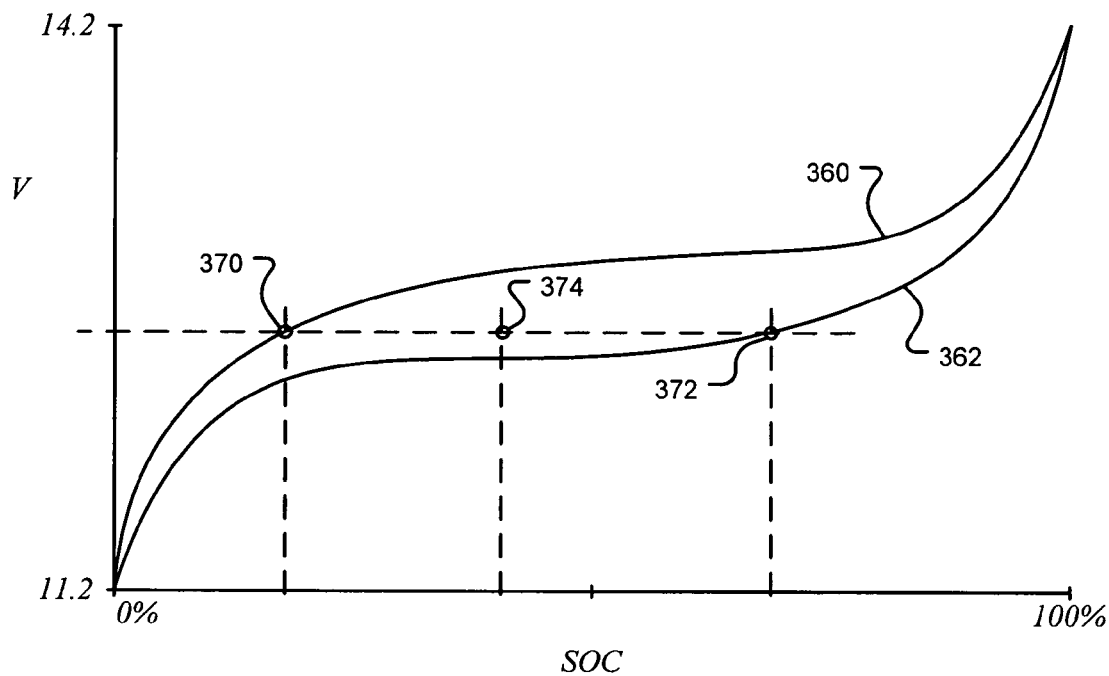
FIG. 9A is a graph of SOC as a function of battery voltage.

Referring now to FIG. 9A, a graph shows an example of SOC as function of the battery voltage V for a NiMH battery. The graph can be stored in the lookup tables 70. The vertical axis represents the battery voltage V and the horizontal axis represents the SOC in percent. An upper curve 360 represents socLow as a function of voltages that are used to determine SOC, where socLow represents a lower limit of SOC vs. the open circuit voltage $V_O$. The values for socLow are associated with battery charging and are described below in more detail. A lower curve 362 represents socHigh as a function of voltages that are also used to determine SOC, where socHigh represents an upper limit of SOC vs. the open circuit voltage $V_O$. The values for socHigh are associated with battery discharging and are also described below in more detail. A spaced relationship between most of the upper curve 360 and the lower curve 362 is indicative of the hysteresis property of some types of batteries, such as NiMH.

In step 354, (FIG. 8) a voltage hysteresis compensation algorithm is used to determine a compensation for the SOC. The compensation algorithm can take the form of $$r = (Vavg - hLowAvg)/(hHighAvg - hLowAvg),$$

where r is a ratio, Vavg is running average of the voltage V from step 254, and hLowAvg and hHighAvg are running averages of the respective low and high reset voltages, hLow and hHigh as calculated in method 450.

Step 354 recalculates the SOC according to the equation $$SOC = socLow + r*[socHigh - socLow],$$

where socHigh and socLow are values from the graph of FIG. 9A. For example, socLow correlates to the SOC at a point 370, socHigh corresponds to the SOC at a point 372, and the recalculated SOC corresponds to the SOC at a point 374.

Figure 9B:
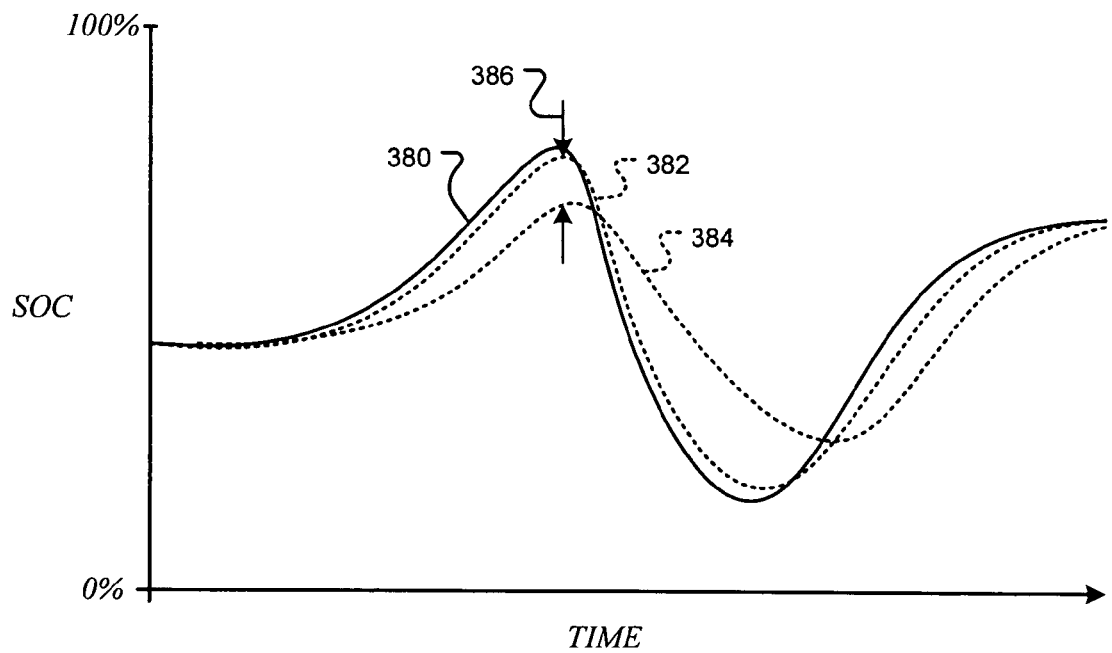
FIG. 9B is a graph of filtered SOC values as a function of time.

Referring now to FIG. 9B, a graph shows the SOC 380 as a function of time. In some embodiments the SOC 380 can be replaced with an integration of battery current over time. The SOC 380 is filtered at a first rate to generate a first filtered SOC 382 and filtered at a second rate to generate a second filtered SOC 384. The first filtered SOC 382 and the second filtered SOC 384 can be compared, such as at 386, to determine the magnitude and direction of a SOC 380 transient. Alternatively, the SOC 380 can be compared to the first filtered SOC 382 and/or the second filtered SOC 384 to determine the magnitude and direction of the SOC 380 transient.

The magnitude and direction of the SOC 380 transient is used in block 356 (FIG. 8) to enter the lookup tables 70 and retrieve a corresponding metric. The metric is applied, such as by multiplication, to the SOC determined in of blocks 280', 300', and 354 to increase the SOC accuracy. The metric for each corresponding magnitude and direction of the SOC transient can be determined experimentally to mitigate a tendency of the open-circuit voltage $V_O$ to exaggerate changes in SOC during the SOC transients.

Figure 10:
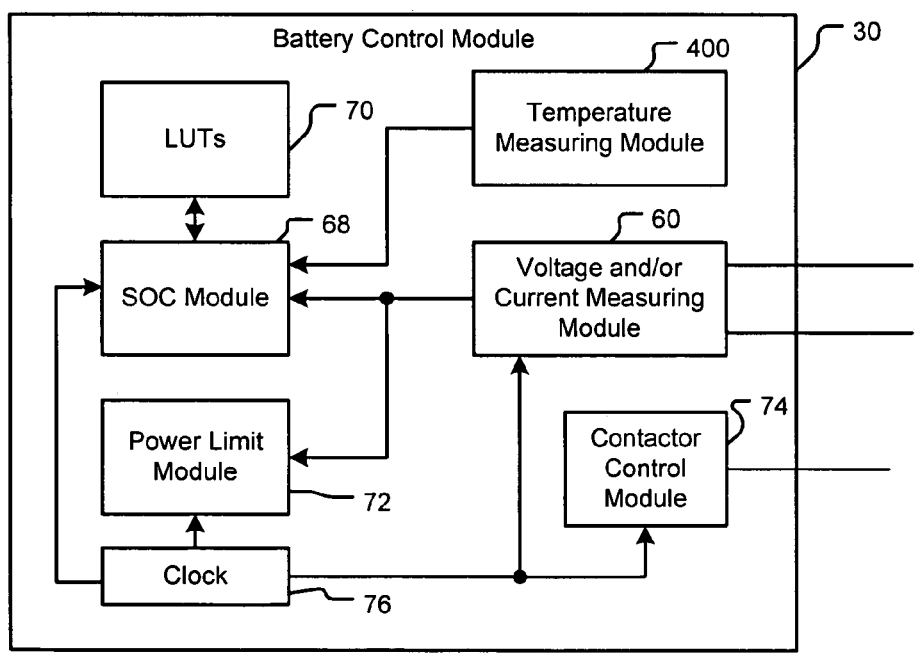
FIG. 10 is a more detailed functional block diagram of a battery control module that includes a temperature measuring module.

Referring now to FIG. 10, a battery control module 30 is shown that includes a temperature measuring module 400. The temperature measuring module 400 measures a temperature of the associated battery subpacks 12. The temperature measurement can be taken at a single point in each battery subpack 12 or derived from temperature measurements taken at a plurality of points in each battery subpack 12. The battery temperature measurements are used to determine the high and low reset voltages in accordance with the method described below.

Figure 11A:
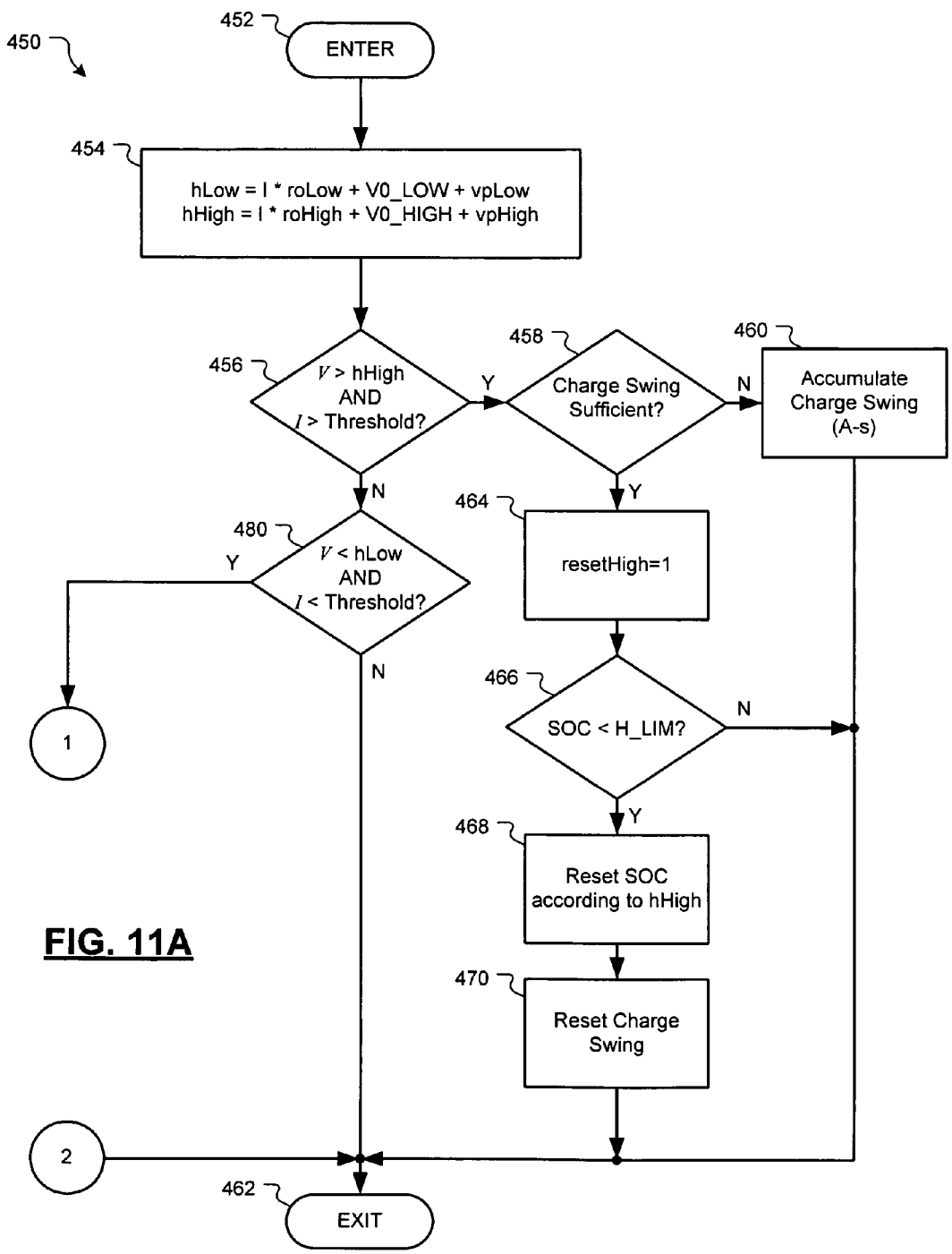
FIGS. 11A and 11B are flowcharts illustrating steps of resetting an estimated battery state of charge.
Figure 11B:
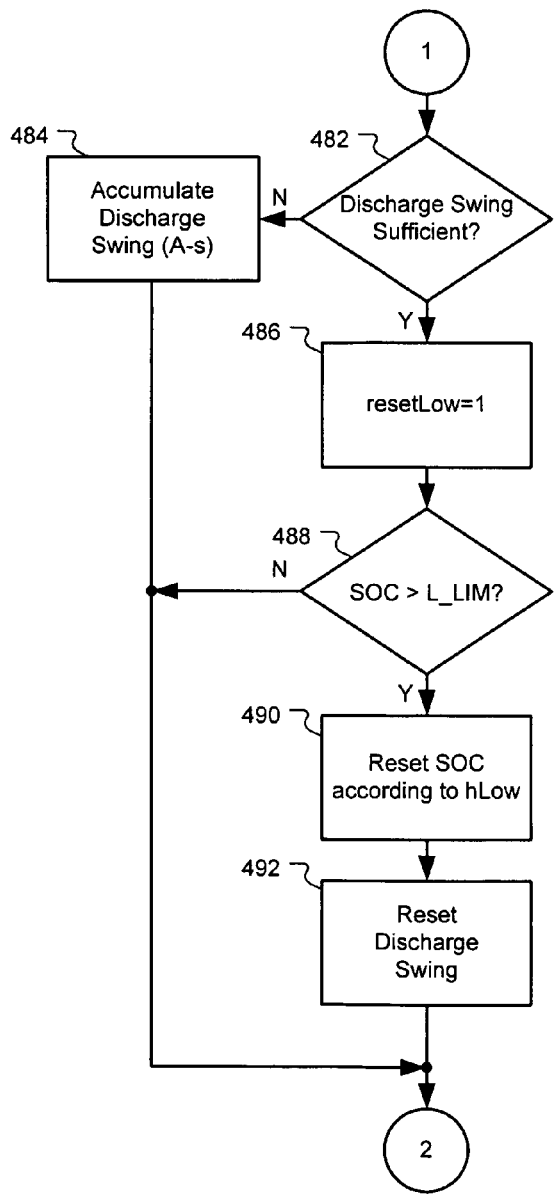

Referring now to FIGS. 11A and 11B, a method 450 is shown for determining when to reset the SOC. The method 450 includes determining a low reset voltage hLow and a high reset voltage hHigh that are selectively compared to the battery voltage V to determine when to reset the SOC. The method 450 includes resetting the SOC when the battery current magnitude is in a predetermined range and the battery voltage is below or above the respective low reset voltage hLow and high reset voltage hHigh.

The method 450 is executed periodically and enters through block 452. In some embodiments, the execution period is equal to the sampling interval T. Control continues from block 452 to block 454 and determines the low reset voltage hLow in accordance with the equation $$hLow = I*roLow + V0\_LOW + vpLow$$

and determines the high reset voltage hHigh in accordance with the equation $$hHigh = I*roHigh + V0\_HIGH + vpHigh.$$

The variables roLow and roHigh represent the ohmic resistance of the battery 20 and can be obtained from the lookup tables 70 as a function of the battery temperature. V0_LOW and V0_HIGH are constants and represent respective low and high limits of the relaxation voltage $V_0$ of the battery 20. The variables vpLow and vpHigh represent the respective low and high limits of the polarization voltage $V_P$. The low polarization voltage limit vpLow and the high polarization voltage limit vpHigh are determined according to a method shown in FIGS. 12A and 12B.

After determining the low reset voltage hLow and the high reset voltage hHigh, control proceeds to decision block 456 and determines whether the battery voltage is greater than the high reset voltage hHigh and the battery current is greater than a current threshold. If so, control proceeds to a decision block 458 and determines whether the present charge event exceeds a predetermined A-s threshold to preclude inadvertently resetting the SOC. If the result of decision block 458 is false, then control proceeds to block 460 and continues to accumulate the charge swing. Control then exits at block 462.

If, in decision block 458, control determines that the charge event is sufficient, then control branches to block 464 and sets a reset-high semaphore. The reset-high semaphore can be used by other modules, such as the master control module 40. Control then branches to decision block 466 and determines whether the present SOC is less than a high limit (H_LIM). The high limit can be a constant percentage, such as 90%. If the present SOC is greater than the high limit, then control exits at block 462. However, if the SOC is less than the high limit, control branches to block 468 and resets the SOC according to the present high reset voltage hHigh (FIG. 9A). Control then branches to block 470 and resets the accumulated charge swing.

Returning to decision block 456, control branches to decision block 480 when the battery 20 voltage and current are less than their respective thresholds. In decision block 480, control determines whether the battery voltage is less than the low reset voltage hLow and the battery current is less than the current threshold. If not, then control branches to block 462 and exits. Otherwise, control branches to decision block 482.

In decision block 482, control determines whether a discharge event exceeds a predetermined A-s threshold to preclude inadvertently resetting the SOC. If the result of decision block 482 is false, then control branches to block 484 and accumulates the discharge swing before exiting at block 462. If, in decision block 482, control determines that the discharge event is sufficient, then control branches to block 486 and sets a reset-low semaphore. The reset-low semaphore can be used by other modules, such as the master control module 40. Control then branches to decision block 488 and determines whether the SOC is greater than a low limit (L_LIM). The low limit can be a constant percentage, such as 10%. Control exits at block 462 if the SOC is less than the low limit. However, if control determines that the SOC is greater than the low limit, then control branches to block 490 and updates the SOC in accordance with the low reset voltage hLow (FIG. 9A). Control then branches to block 492 and resets the accumulated discharge swing.

A method will now be introduced for determining the low polarization voltage limit vpLow and the high polarization voltage limit vpHigh. Referring briefly to FIG. 3 and applying Kirchoffs voltage rules to the battery 20, the instantaneous battery voltage V can be expressed as $$V = V_0 + IR_o + V_p.$$

By including the transfer function for the parallel combination of $R_p$ and C, the equation becomes $$V = V_0 + IR_o + IR_p(1 - e^{\int \frac{-|I|dt}{\tau}}),$$

where τ (tau) represents a time constant of the polarization voltage. The value of tau is used to model the polarization voltage and is determined according to the following method.

Figure 12B:
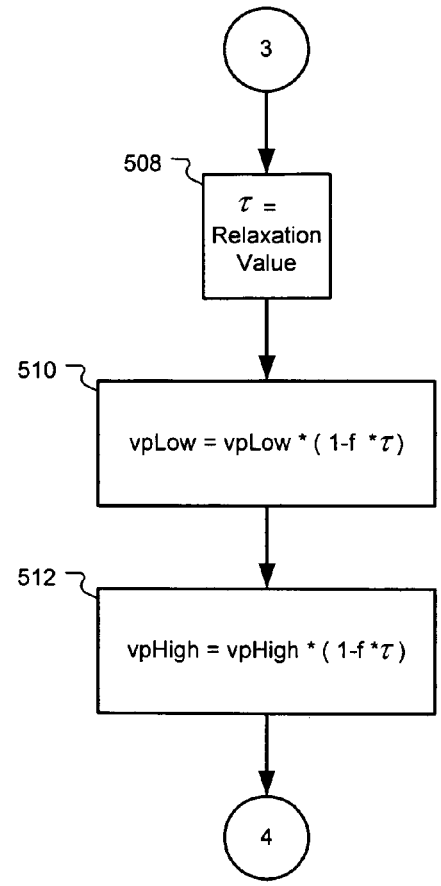
FIGS. 12A and 12B are flowcharts illustrating steps of determining polarization voltage limits used to determine upper and lower reset thresholds.
Figure 12A:
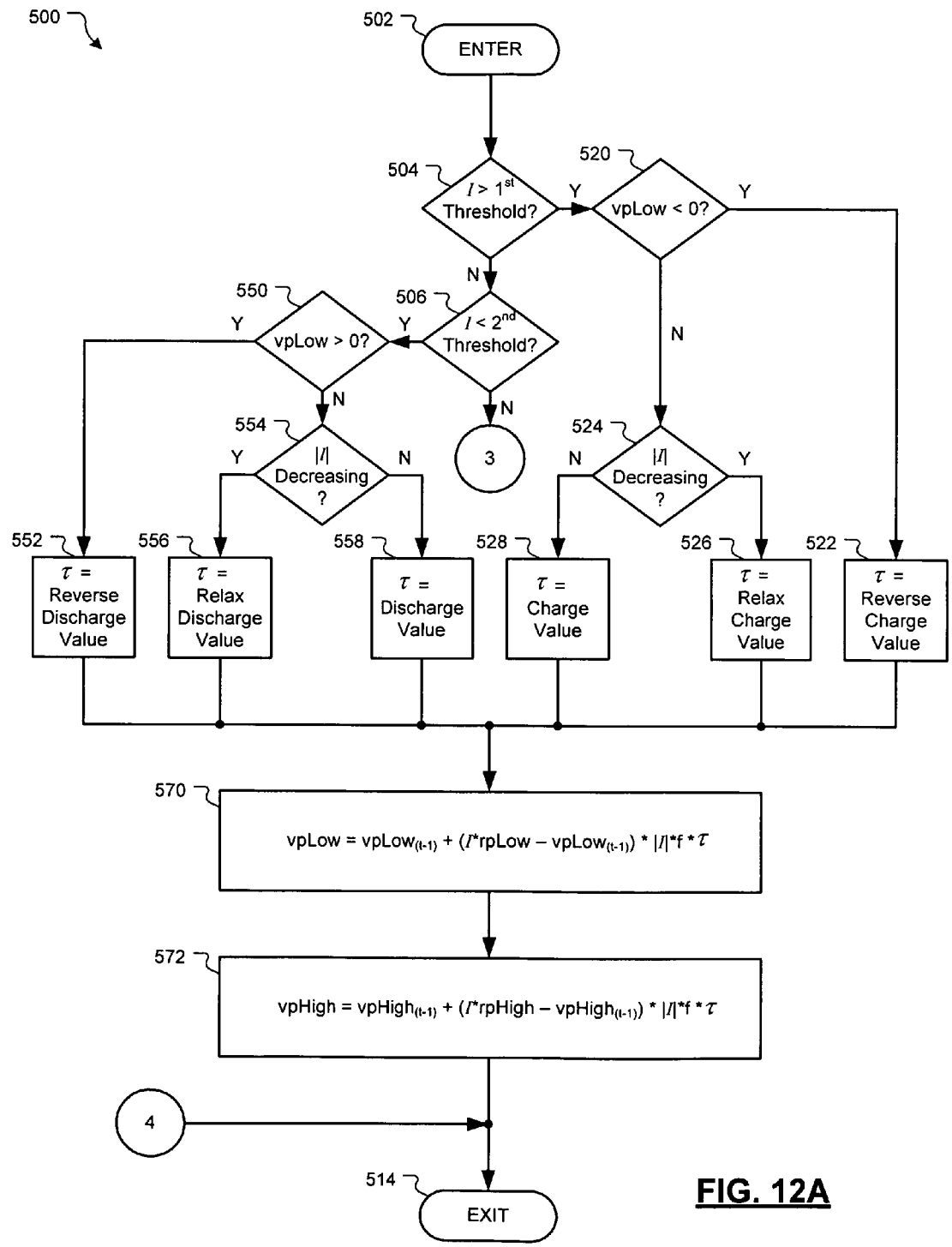

Referring now to FIGS. 12A and 12B, a method 500 is shown for determining the low polarization voltage limit vpLow and the high polarization voltage limit vpHigh. Control enters through block 502 and proceeds to decision block 504. In decision block 504, control determines whether the battery current is greater than a first threshold. If not, then control branches to decision block 506 and determines whether the battery current is less than a second threshold. The first and second thresholds can be set equal to one another. If the current is greater than the second threshold then control branches to block 506 and assigns a relaxation value to tau. The relaxation value, and other values that control assigns to tau as described below, are calibrated according to thermal and aging characteristics of the battery 20.

After assigning the relaxation value to tau, control branches to block 510 and updates the low polarization voltage limit vpLow according to the equation $$vpLow = vpLow*(1 - f*\tau)$$

and updates the high polarization voltage limit vpHigh according to the equation $$vpHigh = vpHigh*(1 - f*\tau),$$

where f represents an execution frequency of the method 500. In some embodiments, the execution frequency f is the reciprocal of the sampling period T. Control then exits at block 514.

Returning to decision block 504, if control determines that the battery current is greater than the first threshold then control branches to decision block 520. In decision block 520, control determines whether the present low polarization voltage limit vpLow is less than zero. If it is, then control branches to block 522 and assigns a reverse charge value to tau. However if, in decision block 520, control determines that the low polarization voltage limit vpLow is greater than or equal to zero then control branches to decision block 524. In decision block 524, control determines whether the magnitude of the battery current is decreasing. If so, then control branches to block 526 and assigns a relax charge value to tau. However if, in decision block 524, control determines that the magnitude of the battery current is increasing then control branches to block 528 and assigns a charge value to tau.

Returning now to decision block 506, if control determines that the battery current is less than the second threshold, then control branches to decision block 550 and determines whether the present low polarization voltage limit vpLow is greater than zero. If it is, then control branches to block 552 and assigns a reverse discharge value to tau. However, if control determines that the low polarization voltage limit vpLow is less than zero, then control branches from decision block 550 to decision block 554. In decision block 554, control determines whether the magnitude of the battery current is decreasing. If it is, then control branches to block 556 and assigns a relax discharge value to tau. If control determines that the magnitude of the battery current is increasing then control branches from decision block 554 to block 558 and assigns a discharge value to tau.

Once the method 500 assigns a value to tau in one of blocks 552, 556, 558, 528, 526 and 522, control branches to block 570 and updates the low polarization voltage limit vpLow according to the equation $$vpLow = vpLow_{(t-1)} + (I*rpLow - vpLow_{(t-1)})*|I|*f*\tau, \quad (5)$$

where the subscript (t−1) refers to a value of the associated polarization voltage limit from a previous execution of the method 500 and rpLow is a lower limit of $R_P$ (FIG. 3). Control then branches to block 572 and updates the high polarization voltage limit vpHigh according to the equation $$vpHigh = vpHigh_{(t-1)} + (I*rpHigh - vpHigh_{(t-1)})*|I|*f*\tau \quad (6)$$

where rpHigh is an upper limit of $R_P$. The variables rpLow and rpHigh can be obtained from the lookup tables 70 as a function of the battery temperature. Control then proceeds to block 514 and exits.

Figure 13:
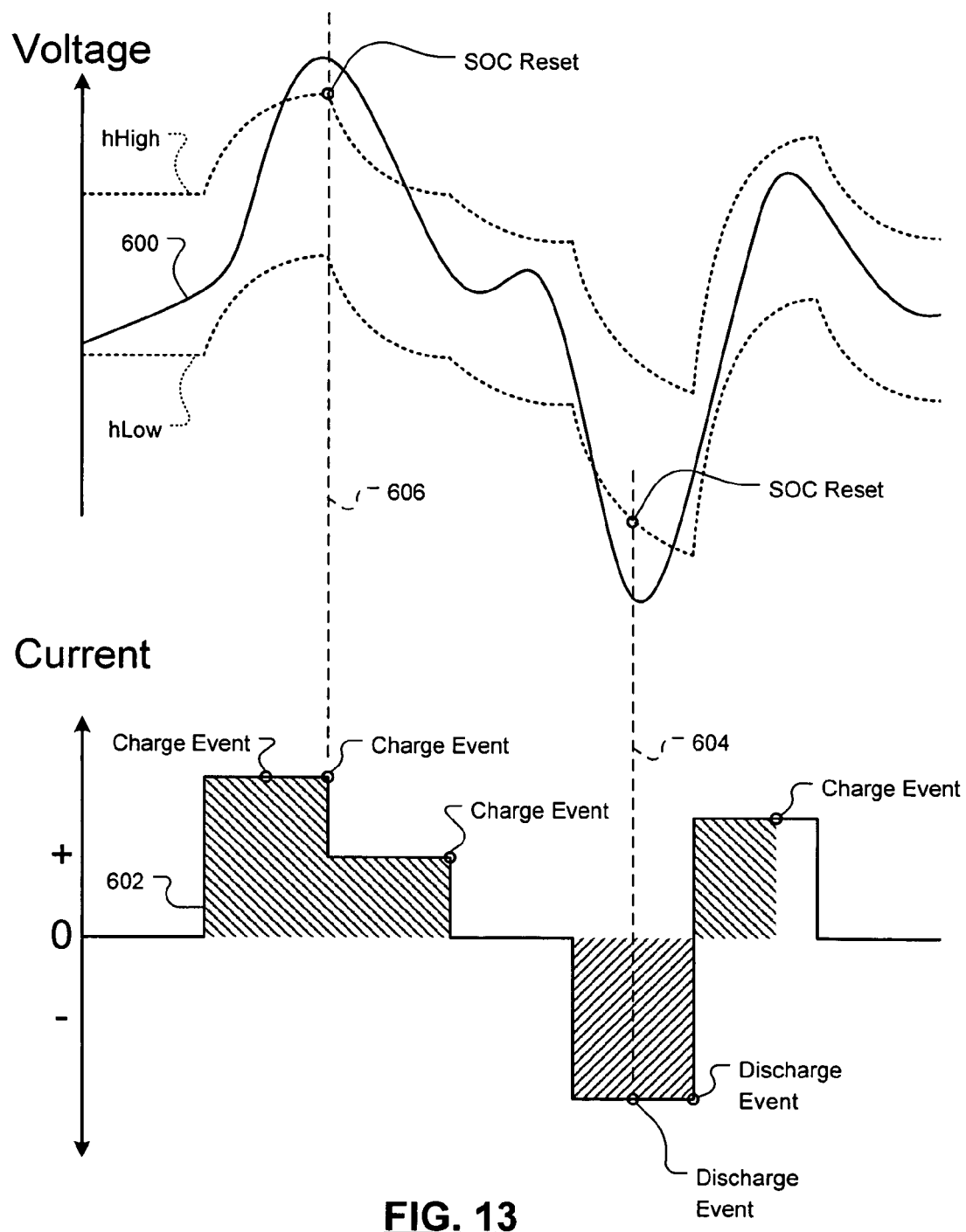
FIG. 13 is a timing diagram of upper and lower reset thresholds, battery voltage, and battery current.

Referring now to FIG. 13, graphs of the battery voltage 600 and the battery current 602 are shown during example high and low SOC resets. The battery voltage 600 is plotted against the high reset voltage hHigh and the low reset voltage hLow. The battery current 602 is shown as flowing in a positive direction (charging) or a negative direction (discharging) over time.

The method 450 periodically determines the high reset voltage hHigh, the low reset voltage hLow, and when to reset the SOC. Example reset situations are shown at times 604 and 606. At time 604, control determines that the battery voltage 600 is less than the low reset voltage hLow when a discharge event is sufficient. Control then determines whether the present SOC is greater than the SOC (FIG. 9A) that corresponds to the low reset voltage hLow and, if so, resets the SOC in accordance with the low reset voltage hLow. Similarly, at the time 606 control determines that the battery voltage 600 is greater than the high reset voltage hHigh when a charge event is sufficient. Control then determines whether the present SOC is less than the SOC that corresponds to the high reset voltage hHigh (FIG. 9A) and, if so, resets the SOC in accordance with the high reset voltage hHigh.

For NiMH batteries, the quantity of numerical values of tau can generally be reduced to four or less while obtaining satisfactory performance from the method 500. A first numerical value is used for tau at block 508 where I is between the first and second thresholds. When the first and second thresholds are equal, the method 500 will not reach block 508 and the first numerical value for tau can be omitted. A second numerical value is used for tau in blocks 528 and 558 where the polarity of $V_P$ (which can be indicated by vpLow$_{(t-1)}$, vpHigh$_{(t-1)}$, and/or other variables) is the same as the polarity of I and dI/dt. A third numerical value is used for tau in blocks 526 and 556 where the polarities of $V_P$ and I are equal to each other and unequal to the polarity of dI/dt. A fourth numerical value is used for tau in blocks 522 and 552 where the polarities of $V_P$ and I are unequal. Performance of the methods 450 and 500 can also be improved for NiMH batteries by populating the lookup tables 70 such that the polarization voltage limits vpLow and vpHigh increase with battery temperature. This can be accomplished by populating the lookup tables with values of rpLow and rpHigh that increase with battery temperature and/or generating families of numerical values for tau where each family corresponds to a particular battery temperature.

In other embodiments, method 500 can be executed once to determine only vpLow (i.e. omit step 572). Method 500 can then be executed again to determine only vpHigh (i.e. omit step 570). In such an embodiment, each execution of method 502 uses an associated set of values for tau in blocks 552, 556, 558, 528, 526, and 522. The value of tau that is chosen when exiting blocks 552, 556, 558, 528, 526, and 522 is termed tauLow when method 502 is determining vpLow. The value of tau that is chosen when exiting blocks 552, 556, 558, 528, 526, and 522 is termed tauHigh when method 502 is determining vpHigh. Executing method 500 twice in such a manner can increase the accuracy of vpLow and vpHigh.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A battery control module for use with a battery, comprising:

a voltage measuring module that measures battery voltage;

a current measuring module that measures battery current; and a state of charge (SOC) module that communicates with said current and voltage measuring modules and that determines a feature of a SOC transient based on a comparison of a measured battery voltage to a first voltage for said battery at an upper reset limit SOC and a second voltage for said battery at a lower reset limit SOC, wherein said first and second voltages are calculated based on an open circuit voltage of said battery, an ohmic resistance of said battery and a polarization voltage for said measured battery voltage, and wherein said SOC module determines an estimated SOC of said battery and a range for said estimated SOC based on a measured battery current and said measured battery voltage, and determines a modified SOC that is based on said estimated SOC, said range and said feature of said SOC transient.

2. The battery control module of claim 1 wherein said SOC module determines said modified SOC based on $$SOC = socLow + (socHigh - socLow)*(vAvg - hLowAvg)/(hHighAvg - hLowAvg),$$

where socLow is a low SOC value in said range, socHigh is a high SOC value in said range, Vavg is a running average of said measured battery voltage, and HLowAvg and hHighAvg are running averages of said second and first voltages, respectively.

3. A method for determining a state-of-charge (SOC) of a battery, comprising:
- measuring a battery voltage;
- measuring a battery current;
- measuring a battery temperature;
- determining a first voltage of said battery at an upper reset limit SOC based on an open circuit voltage of said battery, an ohmic resistance of said battery, a polarization voltage for said measured battery voltage, a measured battery current and a battery temperature;
- determining a second voltage of said battery at a lower reset limit SOC based on said open circuit voltage of said battery, said ohmic resistance of said battery, said polarization voltage for said measured battery voltage, said measured battery current and said battery temperature;
- determining a feature of a SOC transient based on a comparison of said measured battery voltage to said first and second voltages, and
- determining a modified SOC of said battery based on said feature of said SOC transient and estimated SOC of said battery.

4. The method of claim 3 wherein said determining said modified SOC employs equation $$SOC = socLow + (socHigh - socLow)*(vAvg - hLowAvg)/(hHighAvg - hLowAvg),$$

where socLow is a low SOC value in said range, socHigh is a high SOC value in said range, Vavg is a running average of said measured battery voltage, and HLowAvg and hHighAvg are running averages of said second and first voltages, respectively.

5. A battery control module for use with a battery, comprising:
- voltage measuring means for measuring battery voltage;
- current measuring means for measuring battery current; and
- state of charge (SOC) determining means for communicating with said current and voltage measuring means, determining a feature of a SOC transient based on a comparison of a measured battery voltage to a first voltage of said battery at an upper reset limit SOC and a second voltage for said battery at a lower reset limit SOC,
- wherein said first and second voltages are calculated based on an open circuit voltage of said battery, an ohmic resistance of said battery and a polarization voltage for said measured battery voltage, and
- wherein said SOC determining means determining an estimated SOC of said battery and a range for said estimated SOC based on a measured battery current and said measured battery voltage, and determining a modified SOC based on said estimated SOC, said range and said feature of said SOC.

6. The battery control module of claim 5 wherein said SOC determining means determines said modified SOC based on equation $$SOC = socLow + (socHigh - socLow)*(vAvg - hLowAvg)/(hHighAvg - hLowAvg),$$

where socLow is a low SOC value in said range, socHigh is a high SOC value in said range, Vavg is a running average of said measured battery voltage, and HLowAvg and hHighAvg are running averages of said second and first voltages, respectively.

7. The battery control module of claim 1 further comprising a filter that filters said measured battery voltage and outputs a filtered measured battery voltage to said SOC module.

8. The battery control module of claim 1 wherein said feature includes a ratio that corresponds to at least one of a magnitude and a direction of said SOC transient.

9. The battery control module of claim 1 wherein said first and second voltages are calculated based on said measured battery current and a battery temperature.

10. The method of claim 3 further comprising filtering said measured battery voltage prior to determining said feature.

11. The method of claim 3 wherein said feature includes a ratio that corresponds to at least one of a magnitude and a direction of said SOC transient.

12. The battery control module of claim 5 further comprising a filter that filters said measured battery voltage and outputs a filtered measured battery voltage to said SOC determining means.

13. The battery control module of claim 5 wherein said feature includes a ratio that corresponds to at least one of a magnitude and a direction of said SOC transient.

14. The battery control module of claim 5 wherein said first and second voltages are calculated based on said measured battery current and a battery temperature.

* * * * *

UNITED STATES PATENT AND TRADEMARK OFFICE
CERTIFICATE OF CORRECTION

PATENT NO. : 7,570,024 B2
APPLICATION NO. : 11/301754
DATED : August 4, 2009
INVENTOR(S) : Melichar It is certified that error appears in the above-identified patent and that said Letters Patent is hereby corrected as shown below:

Column 1, Line 48, After "can", insert --be--.

Column 5, Line 53, After "power", delete "is".

Signed and Sealed this

Twenty-sixth Day of January, 2010

David J. Kappos
*Director of the United States Patent and Trademark Office*